(12) United States Patent
Borchert

(10) Patent No.: US 9,429,613 B1
(45) Date of Patent: Aug. 30, 2016

(54) TIME DOMAIN REFLECTOMETER

(71) Applicant: Marshall B. Borchert, Lincoln, NE (US)

(72) Inventor: Marshall B. Borchert, Lincoln, NE (US)

( * ) Notice: Subject to any disclaimer, the term of this patent is extended or adjusted under 35 U.S.C. 154(b) by 856 days.

(21) Appl. No.: 13/815,394

(22) Filed: Feb. 28, 2013

Related U.S. Application Data

(60) Provisional application No. 61/690,606, filed on Jul. 2, 2012.

(51) Int. Cl.
*G01R 31/02* (2006.01)

(52) U.S. Cl.
CPC .................................. *G01R 31/021* (2013.01)

(58) Field of Classification Search
CPC .... G01R 13/32; G01R 13/342; G01R 31/11; H03K 3/315; H03K 5/00
USPC .................................................. 324/532–535
See application file for complete search history.

(56) References Cited

U.S. PATENT DOCUMENTS

| | | | |
|---|---|---|---|
| 2,493,800 A | 1/1950 | Biskorn | |
| 2,717,992 A | 9/1955 | Weintraub | |
| 3,462,681 A | 8/1969 | Biskup | |
| 3,609,533 A | 9/1971 | Pardise | |
| 4,491,782 A | 1/1985 | Bellis et al. | |
| 4,499,417 A | 2/1985 | Wright et al. | |
| 4,570,231 A | 2/1986 | Bunch | |
| 5,243,294 A | 9/1993 | Burnett | |
| 5,382,910 A | 1/1995 | Walsh | |
| 5,416,418 A | 5/1995 | Maureia et al. | |
| 5,514,965 A * | 5/1996 | Westwood | G01R 31/11 324/533 |
| 5,751,149 A | 5/1998 | Oberg et al. | |
| 5,903,155 A | 5/1999 | Bjorklund | |
| 6,822,457 B2 | 11/2004 | Borchert | |

* cited by examiner

*Primary Examiner* — Vincent Q Nguyen
(74) *Attorney, Agent, or Firm* — James D. Welch

(57) ABSTRACT

A method of characterizing an electric signal transmission medium as being anomaly free or anomaly containing, involving producing a magnitude vs. time matrix signature by launching a sequence of electric waves thereinto, and accumulating data that show how the electric signal transmission medium reacts to each wave.

11 Claims, 6 Drawing Sheets

WAVEFORM GENERATION AND TRANSMISSION CIRCUITS

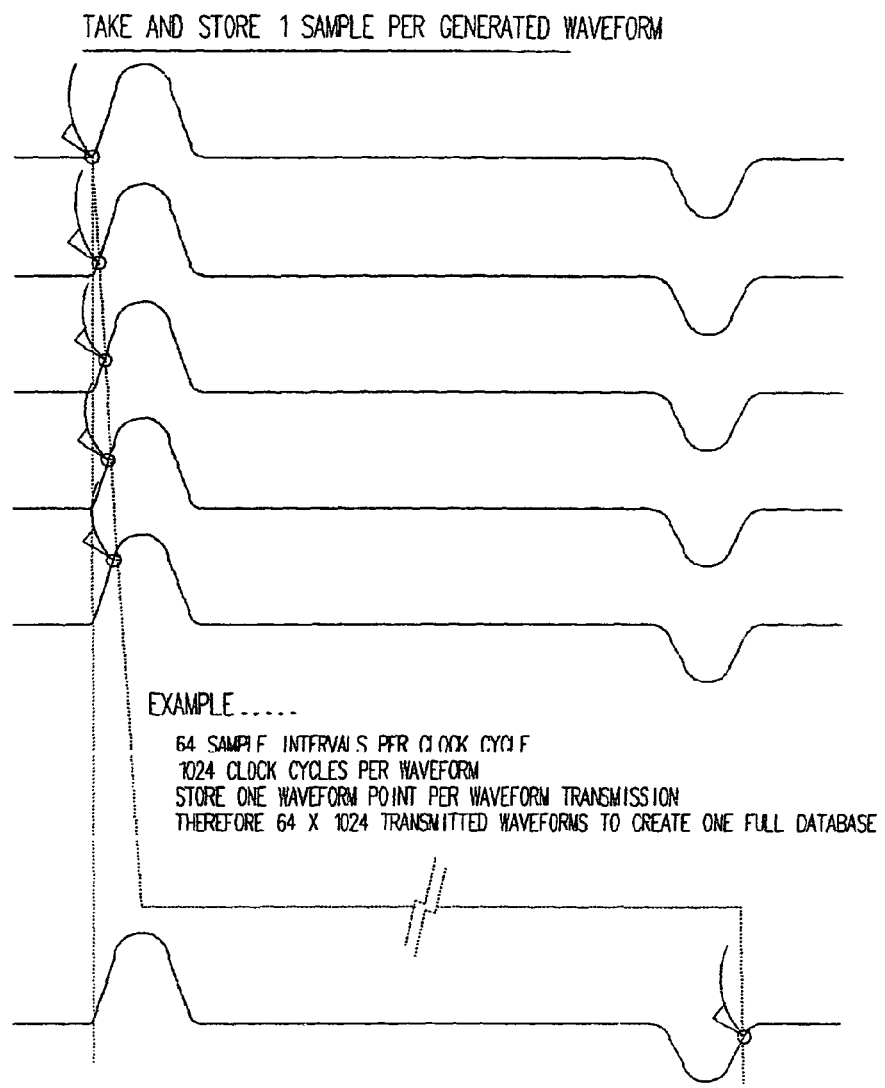
FIG. 1  THE WAVEFORMS ARE STATIC AND
        THE SAMPLER IS TIME SHIFTED
PRIOR ART

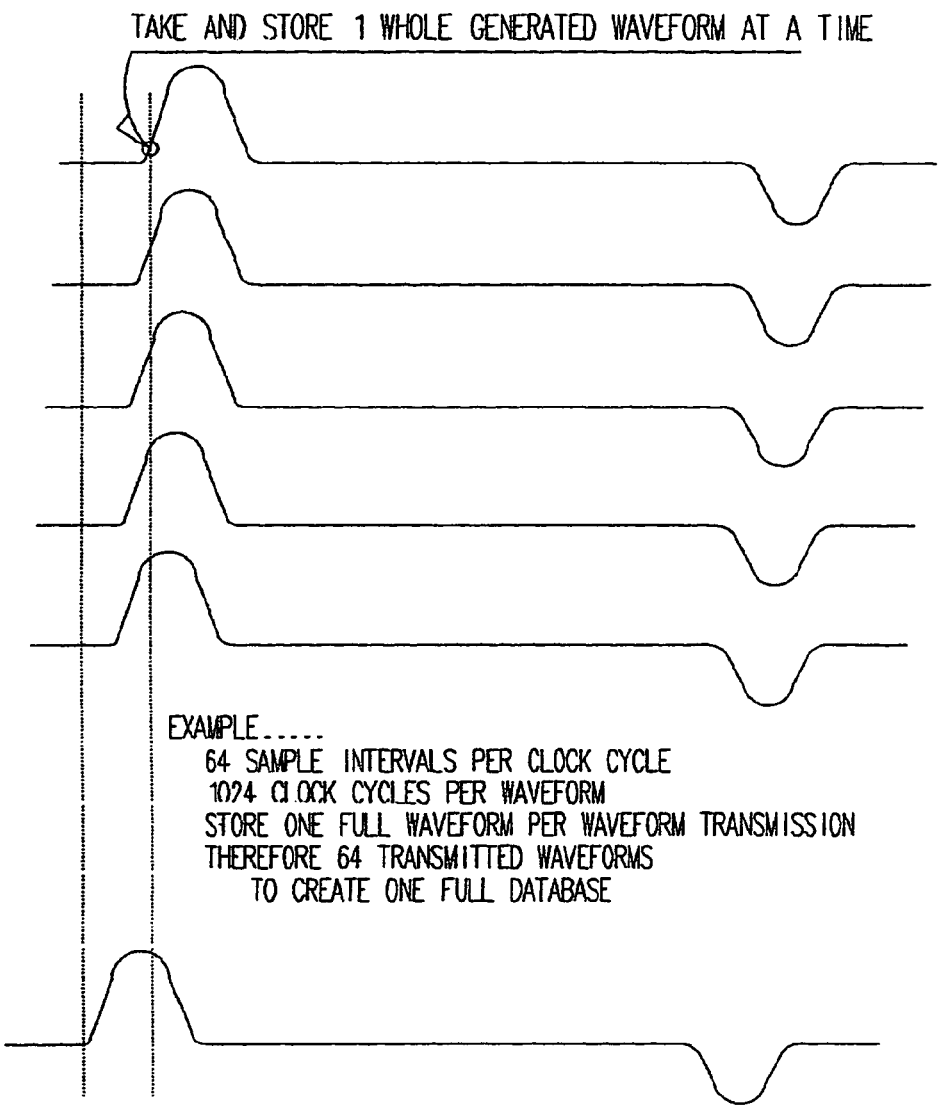
FIG. 2 THE SAMPLER IS STATIC
AND THE TIME GENERATED
WAVEFORM IS SHIFTED

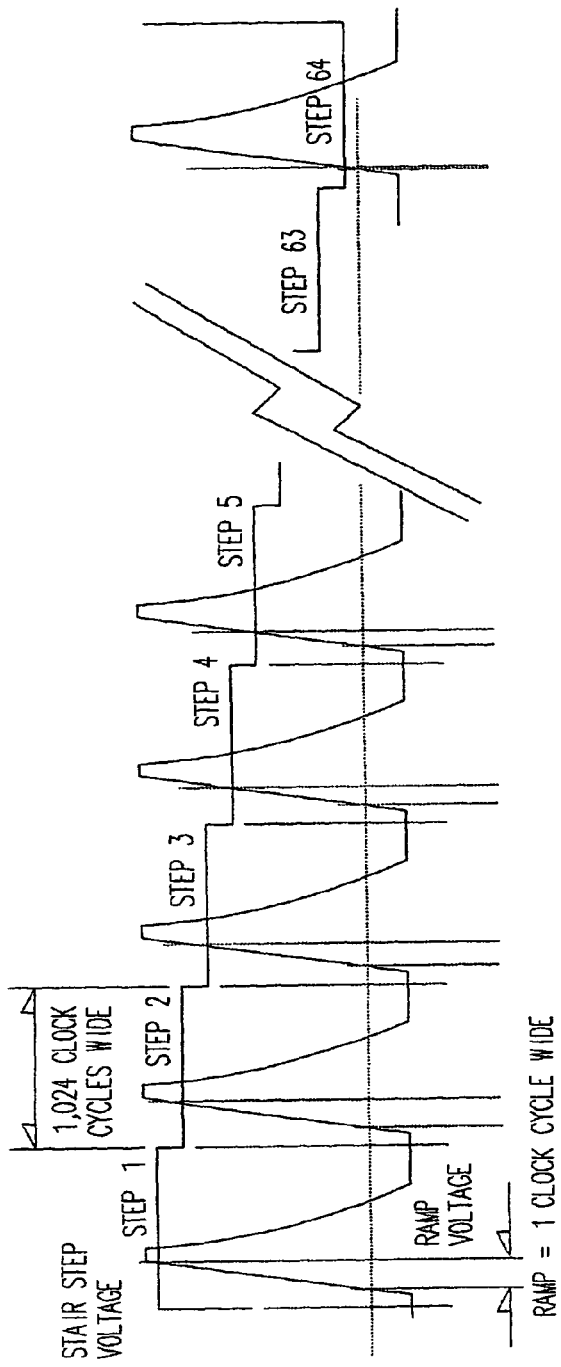
FIG. 3 RAMP AND STEP GENERATOR OUTPUT INTO COMPARATOR TO SKEW TRANSMISSION OF TDR PULSE OUT

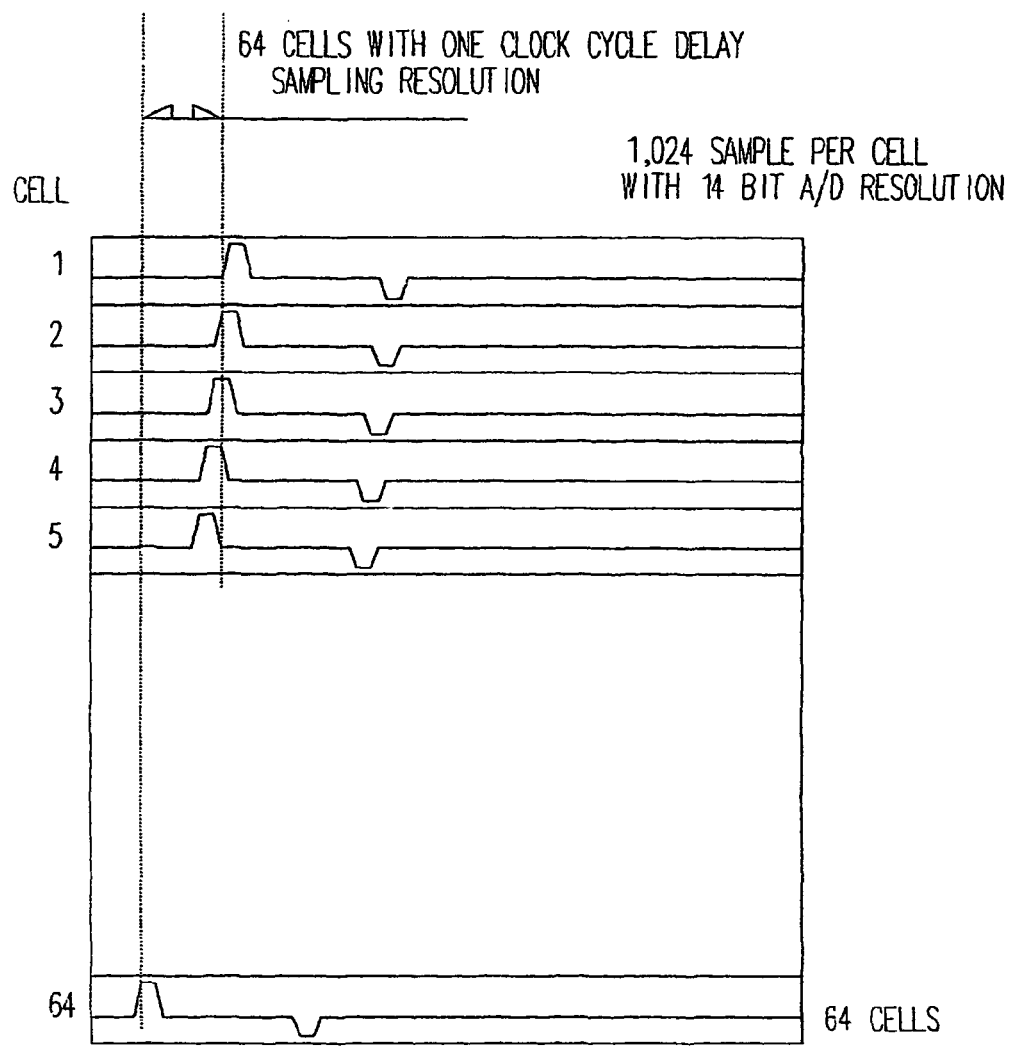
FIG. 4  EXAMPLE OF INDIVIDUAL SKEWED WAVEFORMS

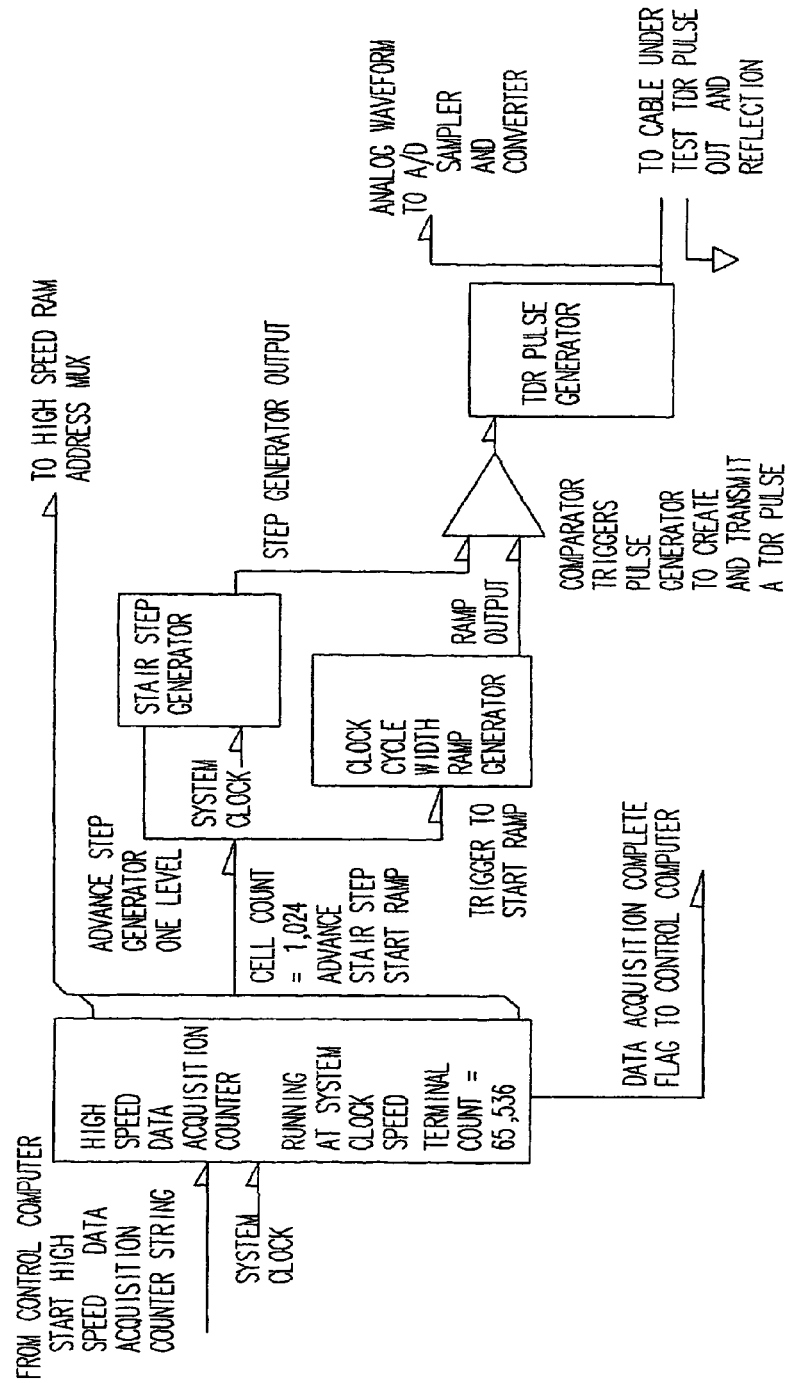
FIG. 5  WAVEFORM GENERATION AND TRANSMISSION CIRCUITS

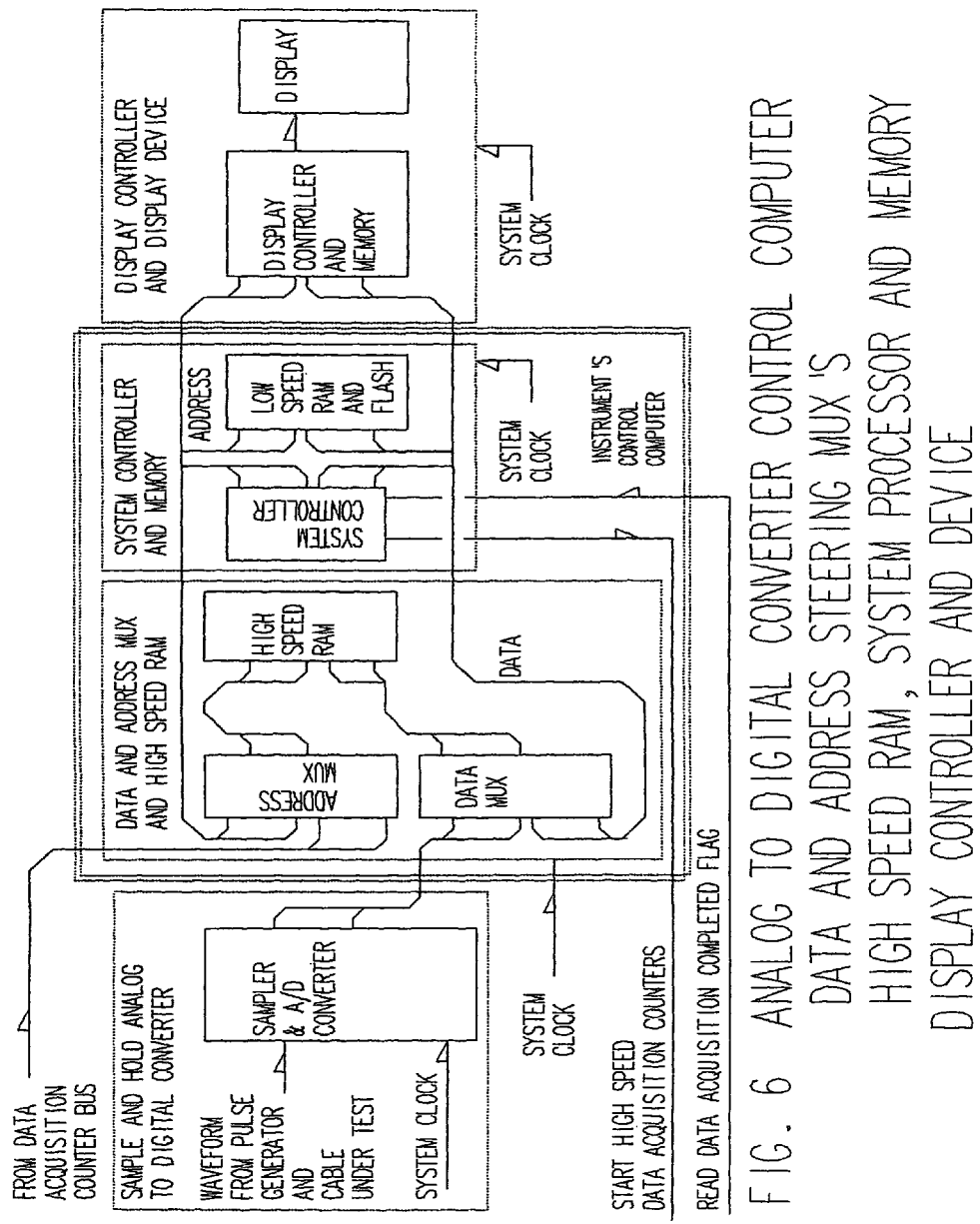
FIG. 6 ANALOG TO DIGITAL CONVERTER CONTROL COMPUTER DATA AND ADDRESS STEERING MUX'S HIGH SPEED RAM, SYSTEM PROCESSOR AND MEMORY DISPLAY CONTROLLER AND DEVICE

# TIME DOMAIN REFLECTOMETER

TECHNICAL FIELD

The disclosed invention relates to application of Time Domain Reflectometer (TDR) to investigate electric media, and more particularly to a method and system for identifying magnitude vs. time matrix of data relating to waves launched onto an electric signal transmission medium, to provide insight into the nature of the signature of the said electric signal transmission medium.

BACKGROUND

In 2004, a Patent to Borchert et al. U.S. Pat. No. 6,822,457 described that a common occurrence in the power distribution industry is an arcing or electrical discharge in the transmission and distribution grid system. Such faults commonly are caused by such as insulation breakdown, physical damage to the transmission line, moisture ingress etc., or a combination thereof, and it is noted, characteristics of an arcing or discharge fault vary widely. For instance, a fault may manifest as a relatively high impedance transient event which lasts for only microseconds, or as a low impedance sustained fault that eventually leads to rupture of network protection devices, (eg. a fuse or circuit breaker or the operation of a circuit breaking relay).

It is to be understood that even minor occurrences of transient discharge in cables can eventually lead to more catastrophic problems because successive discharge events degrade the quality of the cable. Early detection and location of transient fault events, leading to their correction, can therefore result in economic benefits such as increased overall network quality and customer satisfaction because of reduced outages.

Important to the Borchert et al 457 patent is that a consistent characteristic of an arcing or discharge fault event is, at the time of discharge, the generation of a burst of electrical energy or noise which comprises high frequency components. And, it is also important to understand that voltage and/or current waveforms generated by the arcing or discharge fault event travel away from the fault site in both directions in the transmission system. This phenomenon has been disclosed in a number of patents. For instance Biskeborn, U.S. Pat. No. 2,493,800, 1950, Weintraub, U.S. Pat. No. 2,717,992, 1955, Biskip, U.S. Pat. No. 3,462,681, 1969, disclose fault location systems that:

Detect the electrical wave associated with a discharge, partial discharge, arcing fault or lightning strike that travels to each end of the cable or transmission system from the fault point.

Collect time data associated with the traveling wave caused by the fault or event passing a sensor or coupling point at each end of the transmission system.

Calculate distance to fault by centrally processing the time delay data via an RF communications link, or some other data transmission link.

Said Patents describe systems for application to high voltage overhead transmission lines, and assume a velocity of propagation of the traveling wave.

The Biskeborn 800 patent describes an application to shorter cable lengths, but requires access to each end of the cable at a common point.

The Pardis, U.S. Pat. No. 3,609,533, 1971, describes a fault location system which utilizes a high energy pulse transmitted on the network under test to provide a reference for time and/or delay measurements to determine distance to fault, (rather than use of an RF link or other transmission media). The 533 patent generally:

Is applied to high voltage overhead transmission lines;
Is designed for massive insulation breakdown or lightning strike, and provides 500 to 1,000 feet of accuracy; and
Assumes velocity of propagation of the traveling wave.

A Patent to Maureira, U.S. Pat. No. 5,416,418, 1995, describes application in lower voltage, (ie. 6 kV to 33 kV), distribution cables, and focuses on partial discharge events using a pulse transmission technique as a reference/timing signal. The general characteristics of the Maureira invention are:

It is designed for application on shorter power distribution networks than is the Pardis 533 patent system;
It detects much smaller partial discharge or corona discharge faults, (partial discharge faults are periodic, non-catastrophic corona discharge events), that don't necessarily trip circuit breakers or destroy the cable, but do degrade the cable over time;
It requires the cable to be isolated from the distribution network;
It requires a high voltage source to stress the cable into partial discharge activity; and
It assumes velocity of propagation or uses a VOP established during test setup.

Considering previous disclosures and the economic benefit associated with locating faults in a proactive manner, it is apparent that clear commercial advantage can result from application of new technology which provides low cost, accurate fault location methods and apparatus, thereby providing improvement over previously disclosed systems. Characteristics of such a method and apparatus as disclosed in the Borchert et al. 457 patent include:

It monitors and stores the established phenomenon of a traveling wave emanating from an arcing or discharge fault in the time domain,
It co-ordinates the monitoring invention(s) in a manner that allows ratio-metric time to distance calculations versus a known distance between the monitoring systems based on traveling wave time delay measurements and initiating signals,
It improves upon Biskeborn, Weintraub, Biskip, and Pardis, by providing more accurate, higher resolution timing measurements, which, in turn, increase the accuracy of distance to fault calculations,
It improves upon Maureira by allowing the transmission system to remain in service for fault locating,
Unlike the Maureira 418 patent system, there is no requirement that an external, (other than that intrinsic to the distribution system), high voltage be applied to sufficiently stress the transmission system to cause discharge.

A Patent to Bjorklund, U.S. Pat. No. 5,903,155 describes the same fundamental process that Biskeborn, Weintraub, Biskip, Pardis and Maureira use, namely:

Detecting the traveling wave produced by a fault by at least two receivers on each end of the transmission system;
Synchronize the timing of the traveling wave reception via some method so distance to fault calculations can be made.

The specific claims of the Bjorklund patent are:
It specifies High Voltage DC transmission system in the claims;
It uses synchronous clocks at each receiver; and It detects current associated with the traveling wave using a DC transformer and a Rogowski (AC) coil. Previous patents also detect the current.

A Patent to Wright et al U.S. Pat. No. 4,499,417 describes a single ended system that uses the disturbance created by the fault and subsequent reflections. In summary;

It detects the first instance of a disturbance created by a fault in either voltage or current;

It identifies and labels that particular event using either voltage or current characteristics;

It continues to analyze the transmission line comparing subsequent events to the first using the characteristics as above or predicted characteristics based on knowledge of the transmission line;

It measures time taken for the disturbance to travel from initial characterization, travel to the fault and back as a reflection;

It determines distance to the fault based on time measurement data; and

Distance to Fault calculations are based on a signal propagation velocity constant determined by the type of transmission line.

A Patent to Bunch U.S. Pat. No. 4,570,231 describes the same fundamental process that Biskeborn, Weintraub, Biskip, Pardis and Maureira uses, namely:

It detects the traveling wave produced by a fault by at least two receivers on each end of the transmission system;

It synchronizes the timing of the traveling wave reception via some method so distance to fault calculations can be made;

The specific claims of the Bunch patent are:

It comprises a fault finder for locating fault on a high voltage transmission line;

It provides improved filtering to reject background noise to allow easier identification of a fault;

It synchronizes time delay measurements using a conventional modem communication link between the two receiving stations.

A Patent to Burnett U.S. Pat. No. 5,243,294 discloses a complex system for determining the likelihood of a physical anomaly in an elongate, electrically conductive member, such as an oil or gas pipeline. The technique is based on sending two pulses from either end of the physical body to be evaluated. Further, It synchronizes the two pulse generators at either end of the physical body so that the collision point of the two pulses traveling from each end can be predicted;

It scans the collision point of the pulses along the physical body; and

It evaluates the characteristics of the collision of the waves to determine the probability of a physical anomaly.

A Patent to Bellis et al U.S. Pat. No. 4,491,782 describes improvement to Time Domain Reflectometry, also known as Pulse Echo. This patent is targeted to unstable, transitory faults, as well as stable faults in energized power cable. It discloses:

Continuing, a TDR technique for power transmission lines is characterized by;

It uses current or voltage sensors to determine if a fault is occurring;

It stores a series of before fault and after fault TDR waveforms; and

It compares the healthy TDR waveforms to the faulty TDR waveforms to aid in discerning the fault location.

A Patent to Walsh U.S. Pat. No. 5,382,910 describes improvement to Time Domain Reflectometry by canceling out the blind spot or dead zone inherent in any TDR system during the transmission of the test pulse.

A Patent to Oberg et al. U.S. Pat. No. 5,751,149 describes improvement to Time Domain Reflectometry by implementing a very high and adjustable frequency transmit pulse to allow frequency sensitive faults to be more visible to the TDR.

A Patent to Westwood U.S. Pat. No. 5,514,965 describes improvement to Time Domain Reflectometry by using new technology, a digital, programmable delay generator device as a TDR timebase to improve resolution of fault reflections.

Continuing, in some cases, such as where a low voltage power is distributed to residences and industry, it can be hazardous to public safety to apply any form of high voltage. Further it is desirable to allow customers to continue to be served with power while a system is being tested. In that light it is noted that the presently disclosed invention uses the AC signal being distributed as the source of its signal, (emphasis added). This improves upon the Maureira 418 patent approach, (which may actually create a fault at a previous non-faulted site), by not further damaging the transmission system with a high voltage source. The presently disclosed invention also determines a velocity of propagation, which is used for distance calculations, at an instant just before a fault occurs, which improves accuracy because velocity of propagation can change with cable type, age, time, power loading and ambient temperature. The presently disclosed invention further initiates invention system data storage before a fault, rather than after a fault. This is beneficial because where a fault is catastrophic enough to create a complete open or short circuit, an initiating signal path does not exist.

At this point it is disclosed that the Borchert et al 457 Patent invention improved upon all the cited prior art by providing initiation of invention system operation before a fault, rather than after a fault. This is important as velocity of propagation can be affected by AC power current loading over time and fault current. Further, the Borchert et al 457 patent disclosed invention provides an initiating signal in the form of a coherent spectrum that can be filtered and amplified to increase resolution and/or noise immunity.

Even in view of the known prior art, there remains need for a system and method and system for identifying magnitude vs. time matrix of data relating to waves launched onto an electric signal transmission medium, to provide insight into the nature of the signature of the said electric signal transmission medium.

DISCLOSURE OF THE INVENTION

The present invention is a method of assembling a magnitude vs. time matrix of data relating to waves launched onto an electric signal transmission medium, to provide insight into the nature of the signature of the said electric signal transmission medium. The method comprises the steps of:

a) providing a ramp voltage producing circuit comprising an output, a stair-stepped voltage producing circuit comprising an output and a voltage comparator circuit comprising two inputs and an output, said ramp voltage producing circuit being attached to one of said comparator circuit inputs and said stair-stepped voltage producing circuit output being attached to the other of said comparator circuit inputs;

b) providing a triggering circuit comprising an input and output, and a circuit for producing electric waves that can be launched on an electric signal transmission medium comprising an input and output, said trigger circuit output being attached to said input of said circuit for producing said waves, and said output thereof to said electric signal transmission medium;

c) providing a wave monitoring and data storage system for acquiring and saving data relating to the waves produced and launched onto an electric signal transmission medium by said circuit for producing electric waves; and d) providing an electric signal transmission medium.

In use said ramp voltage producing circuit comprising an output is caused to producing a ramp voltage and feed it into one of the inputs of the voltage comparator circuit, and said stair-stepped voltage producing circuit comprising an output is simultaneously caused to producing a stair-stepped circuit and feed it into another of the inputs of the voltage comparator circuit inputs. When the voltages presented at the comparator circuit inputs are equal, a signal is sent by the comparator circuit to said trigger circuit, and the trigger circuit produces a signal at its output which is entered to said input of said circuit for producing said electric waves, such that an electric wave is launched onto an electric signal transmission medium thereby.

Said method then further comprises:

e) causing said wave monitoring and data storage system for acquiring and saving data attached to said output of said circuit for producing electric waves, to monitor and save data pertaining to each electric wave launched onto said electric signal transmission medium and tangibly displaying at least some of the monitored monitored and saved data.

Said method can involve causing a plurality of electric waves to be sequentially launched onto said electric signal electric transmission medium, each at a time corresponding to one of the stair-stepped output voltages of said stair-stepped voltage producing circuits.

Said method can involve the wave monitoring and data storage system monitoring and saving a plurality of data points for each electric wave launched onto said electric signal transmission medium.

Said method can involve that the wave monitoring and data storage system monitors and saves, for each electric wave launches onto said electric signal transmission medium, a plurality of data points for waves reflected from points on said electric signal transmission medium; said saved plurality of reflected data points serving to provide insight into the nature of the signature of the said electric signal transmission medium.

Said method can involve the electric signal transmission medium being an electric signal transmission line, and can involve there being an impedance anomaly therein which is identified by practice of said method.

An alternative recital of the present invention method provides that it is a computer controlled method of assembling a magnitude vs. time matrix of data relating to waves launched onto an electric signal transmission medium, to provide insight into the nature of the signature of the said electric signal transmission medium, comprising:

a) said computer is configured to control a system comprising:

a ramp voltage producing circuit comprising an output, and a stair-stepped voltage producing circuit comprising an output and a voltage comparator circuit comprising two inputs and an output, said ramp voltage producing circuit being attached to one of said comparator circuit inputs and said stair-stepped voltage producing circuit output being attached to the other of said comparator circuit inputs; and a triggering circuit comprising an input and output, and a circuit for producing waves that can be launched on an electric signal transmission medium comprising an input and output, said trigger circuit output being attached to said input of said circuit for producing said waves, and said output thereof to said electric signal transmission medium; and a wave monitoring and data storage system for acquiring and saving data relating to the waves produced and launched onto an electric signal transmission medium by said circuit for producing electric waves; and an electric signal transmission medium.

Said method then further comprises:

b) said computer controlling said ramp voltage producing circuit comprising an output to produce a ramp voltage and feed it into one of the inputs of the voltage comparator circuit, and said computer controlling said stair-stepped voltage producing circuit comprising an output is simultaneously caused to produce a stair-stepped voltage and enter it to another of said circuit inputs, such that when the voltages presented at the comparator circuit inputs are equal, said comparator circuit sends a signal to said trigger circuit and the trigger circuit produces a signal at its output which is entered to said input of said circuit for producing said electric waves, such that an electric wave is launched onto an electric signal transmission medium thereby; and c) said computer causing said wave monitoring and data storage system for acquiring and saving data attached to said output of said circuit for producing electric waves, to monitor and save data pertaining to each electric wave launched onto said electric signal transmission medium, and reflections thereof from said electric signal transmission medium.

Said method can involve the electric signal transmission medium being an electric signal transmission line, and can involve there being an impedance anomaly therein which is identified by practice of said method.

BRIEF DESCRIPTION OF THE DRAWINGS

FIG. 1 shows prior application of TDRs that time resolution expansion of a TDR data acquisition sampler was incremented in small equal and predetermined steps over the system clocks single cycle time period in multiple small time elements between system clock periods.

FIG. 2 shows that in order to expand the time resolution of the instrument, a present invention TDR signal is incremented in small equal and predetermined steps over the system clocks single cycle time period and all the rest of the TDRs systems are kept at clock frequency.

FIG. 3 shows simultaneous multiple window displays of Independent and simultaneous data acquisition (H/W) and data manipulation (S/W).

FIG. 4 shows two signals being fed into a comparator which then triggers a pulse generator to create and transmit a TDR pulse that feeds the cable under test and data acquisition network.

FIG. 5 shows a set of counters that feeds clock skewing elements made up of a voltage ramp generator (C) that ramp width is exactly matched to the system clock period (20 nsec) and a stair step generator (D) which creates (i.e. 64 steps in total) a new step at every time the system creates a new TDR pulse and reflection waveform.

FIG. 6 shows a skewed waveform is fed into an A/D converter where the waveform is converted to some fixed number of words with some fixed number of bits per word, and stored in high speed memory clocked at the instruments system clock frequency.

DETAILED DESCRIPTION

It is first noted that the description herein focuses on a Time Domain Reflectometer (TDR), but the concept is relevant to other types of applications and instruments of the same class.

The TDR fits into a small class of electronic devices (i.e. TDRs, spectrum analyzers, radar, etc.) in that the signal generator, the waveform acquiring apparatus, and display device are integral to the overall instrument and to each other and not separable to the complete system.

The focus is to:
(A) explain the concept of expansion of sampling resolution over the actual bandwidth limitations of the analog to digital converter (A/D) and its integral system (memory and control devices); and
(B) explain and compare the method is acquiring (sampling) and displaying the information (waveforms) of the previous art and the proposed new art.

Turning now to the Drawings, FIG. 1 shows that in the prior art of developing TDRs, in order to expand the time resolution of the instrument the TDRs data acquisition sampler was incremented in small equal and predetermined steps over the system clocks single cycle time period in multiple small time elements between system clock periods. In this fashion, the TDR could acquire and display a signal that had greater signal bandwidth than the TDRs clock period (and other components) allowed. The major disadvantage of the prior art (see table 1) is that only one sample could be taken per transmitted and received TDR signal. Therefore, a great amount of time was required to acquire a complete display.

In the presently disclosed invention, FIG. 2 shows that in order to expand the time resolution of the present invention a TDR signal is incremented in small equal and predetermined steps over the system clocks single cycle time period and all the rest of the TDRs systems are kept at clock frequency. Therefore, the whole of each transmitted and received waveform can be sampled and displayed and the time it takes to acquire a complete display is greatly reduced by several magnitudes (see table 1).

Because, as shown in Table 1, the prior art method had such a long acquisition time that it was impractical to acquire, store, and display such large amounts of data and that the old method encouraged a significant compromise in greatly limiting the amount of data gather and retained in storage. This compromise was acceptable in the field environment but greatly limited post-acquisition data analysis.

Because of the greatly reduced amount of time for acquiring a large and complete waveform data base, the new method can now displays and stores a full resolution waveform, with more time resolution (signal bandwidth), and in much less (display device) time than the previous art method. The new method creates the display in much less time because the system is recording one whole waveform at a time (at system clock frequency and sampling interval) rather than one sample per transmitted waveform at a time. The present new method creates much larger files and faster for better post-recording display and analysis. Said new method is implemented with simpler electronic system. This new method is further enhances by the fact that, now days, the sampler, many times, is built into the A/D converter. The new method allows simpler and faster waveform processing because the

TABLE 1

FILE: TDR PATENT APR. 8, 2012 MARSHALL BORCHERT

TABLE 1

| | | |
|---|---:|---|
| SYSTEM CLOCK = | 50 | MHZ |
| CLOCK INTERVAL = | 20 | NSEC |
| # SAMPLING GROUPS = | 64 | |
| SAMPLING RESOLUTION = | 0.3125 | NSEC |
| # SAMPLES PER WAVEFORM = | 1024 | WORDS |
| TOTAL TIME PER WAVEFORM = | 20.48 | USEC |
| TOTAL # SAMPLES IN A COMPLETE WAVEFORM DATA BASE PREVIOUS METHOD | 65,536 | WORDS |
| TOTAL TIME PER WAVEFORM = | 20.48 | USEC |
| TOTAL # SAMPLES IN A COMPLETE WAVEFORM DATA BASE = TOTAL ACQUISITION TIME | 65,536 | WORDS |
| (1 SAMPLE PER WAVEFORM) = | 1,342,177.28 | USEC |
| | 1,342.18 | MSEC |
| | 1.34 | SECONDS |
| NEW METHOD | | |
| TOTAL TIME PER WAVEFORM = | 20.48 | USEC |
| # SAMPLE GROUPS = TOTAL ACQUISITION TIME | 64 | |
| (1,024 SAMPLES PER WAVEFORM) = | 1310.72 | USEC |
| | 1.31 | MSEC |
| | 0.001 | MSEC |
| OLD = | 1,342,177.28 | USEC |
| NEW = | 1310.72 | USEC |
| DIFFERENCE. IN ACQUISITION TIME MAGNITUDE = | 1,024 | | whole waveform (in time (i.e. 0.3 nsec resolution), and space (i.e. 14 bits)) is continually acquired and stored and at full system resolution amplitude and speed in RAM. Increased waveform accuracy processing regardless of the horizontal and/or vertical zoom display level for such things as (but not limited to) Signal averaging (noise reduction) Fault measurements (dBRL) Distance to the fault (discontinuities) measurement. FIG. 3 shows simultaneous multiple window displays of Independent and simultaneous data acquisition (H/W) and data manipulation (S/W). The new method allows the whole (TDR) system to operate as a fully synchronous (single system clock) system.

In the prior art a method of obtaining analog to digital values in greater resolution beyond the systems clock frequency was to create a ramp voltage whose period was exactly matched to the period of the system clock. This ramp then fed into a comparator whose other input was a step generator. These two inputs then created an output that drove a sampler that took a fixed number of samples equidistant from the system clocks starting edge during the system clock frequency. In the development of a new TDR (time domain reflectometer), this technique has a major drawback in that todays integrated circuit A/D (analog to digital) converters also tend to have integrated samplers built into them. Therefore, a new technique, built on the previous art, needed to be developed. Another unique feature of a TDR is that the instrument contains a pulse generator that is synchronized to the system plus a data acquisition and storage element that is also synchronized to the system. That is, the TDR is a closed system with signal output and signal input; the only thing external to the TDR is the cable under test. Therefore, the unique feature developed was to time delay (modulate) the output pulse and leave all other elements (system clock, A/D converter, storage elements (RAM) system control logic, and microprocessor), fixed to the instruments system clock. Another side benefit of this process is that (A) each (time delayed) waveform in full A/D value and time value can be stored and (B) all the time incremented waveforms of a clock cycle can be stored for later study and archiving.

An example is shown here to further explain the concept of the resolution that can be easily obtained using present day off the shelf components: In the present art of the electronics available off the shelf, Analog Devices has a 14 bit A/D converter with built in sample and hold front end that can be clocked up to at least 65 MHz. If the TDRs clock is run at, say, 50 MHz then the clock period is 20.0 nsec. If the clock period is then divided into 64 increments then the resolution between sampled waveforms is 0.3125 nsec. If each of the 64 waveforms is, say, 1,024 samples long this equates to a 64K, 50 MHz RAM. If, say, the cable under test has a Velocity of Propagation (VOP)=80% then a cable of about 6,700 feet can be tested and stored for later study with a full time and voltage resolution as stated above. Method of operation of data acquisition system. The core of the process is to (A) capture a whole TDR pulse transmission and reflection waveform at a single time and (B) skew successive transmissions of the TDR waveform in order to increase waveform time resolution as compared to the overall system clock resolution. As an example of (A) the A/D (Analog to Digital converter) samples the TDRs pulse transmission and reflection at system clock frequency (example 50 MHz or 20 nsec per sample) with a fixed resolution (example 1024 samples) and stores this data in high speed RAM memory. Then the instrument circuits (B) skew the next transmission of a next TDR pulse and reflection waveform by a fraction of the 20 nsec clock frequency. This two step process is repeated a number of times (example 64 times) then all the stored waveforms are compiled into a single display with a greatly improved time resolution (example 20 nsec divided by 64=312.5 psec per sample. As shown in FIG. 3, the mechanism for skewing the TDRs waveform is by creating a ramp generator that is exactly one system clock wide and a stair step generator that each step is 1,024 system clock cycles wide. FIG. 4 shows these two signals are fed into a comparator which then triggers a pulse generator to create and transmit a TDR pulse that feeds the cable under test and data acquisition network.

As shown in FIG. 5, a set of counters (in our case that is comprised of 16 bits (65,536) that later to be described high speed RAM) and has a sub-count output (at, say, 1,024) that feeds the clock skewing elements made up of two systems:
(C) a voltage ramp generator that ramp width is exactly matched to the system clock period (20 nsec); and
(D) a stair step generator which creates (i.e. 64 steps in total) a new step at every time the system creates a new TDR pulse and reflection waveform.

These two voltages (ramp and stair step) are fed into a comparator and the combined voltages create a skew of the system clock This waveform skewing system then drive the TDR pulse generator that then tests the cable under test. The waveform of this pulse generator along with the cable reflection also has an output that feeds the A/D converter.

As shown in FIG. 6 the skewed waveform is fed into the A/D converter where the waveform is converted to some fixed number of words with some fixed number of bits per word (i.e. 1,024 fourteen bit words) and stored in high speed memory clocked at the instruments system clock frequency. The data addresses are controlled by the above mentioned (16 bit binary) counter (where 64 waveforms that are each 1,024 words long equals 65,536 words). Once the waveform data is stored the high speed (16 bit) counter indicates it has reached terminal count which triggers the system controller to switch the multiplexers to its data and address busses and move the high speed RAM data to the processors low speed RAM for further data manipulation. This manipulation is in the form of: Further data analysis, Semi-permanent storage in FLASH memory, Export to the outside world via USB, And/or transfer to the display controller for further transfer to the display itself. It is also noted that all elements of the system described can be automatically operated by a computer.

A point of clarification:

The control computer triggers the data acquisition system to acquire data by enabling the computer string (FIG. 5) to count system clock cycles.

When this counter reaches the "waveform cell count value (in our case=1,024), this count value triggers the stair step generator to advance one value and starts the ramp circuit to create a ramp. When the stair step value are voltages equal this triggers the comparator to trip and allow generation of a pulse out waveform.

Once all waveform data cells (in our case 64) are full (the counter string reaches terminal count) then the counter string sets a flag for the control computer to read (at its leisure). The counter string stops operation until the control computer again enables it to start another data acquisition cycle.

Therefore, you can see that the control computer is in complete control of the sequencing of the whole operation.

Having hereby disclosed the subject matter of the present invention, it should be obvious that many modifications, substitutions, and variations of the present invention are possible in view of the teachings. It is therefore to be understood that the invention may be practiced other than as specifically described, and should be limited in its breadth and scope only by the Claims.

I claim:

1. A method of characterizing an electric signal transmission medium as being anomaly free or anomaly containing, comprising the steps of:
   a) providing a system comprising an electric signal transmission medium, a ramp voltage producing circuit, a stair-stepped voltage producing circuit, a comparator circuit, a triggering circuit, a circuit for producing electric waves that are launched on an electric signal transmission medium, and a wave monitoring and data storage system;
   said ramp voltage producing circuit comprising an output, said stair-stepped voltage producing circuit comprising an output and said voltage comparator circuit comprising two inputs and an output, said ramp voltage producing circuit being attached to one of said comparator circuit inputs and said stair-stepped voltage producing circuit output being attached to the other of said comparator circuit inputs,
   said triggering circuit comprising an input and output, the input of which is attached to the output of said comparator circuit, and said circuit for producing electric waves that are launched on an electric signal transmission medium comprising an input and output, said trigger circuit output being attached to said input of said circuit for producing said waves, and said output thereof to said electric signal transmission medium; said wave monitoring and data storage system enabling acquiring and saving data relating to the waves produced and launched onto an electric signal transmission medium by said circuit for producing electric waves;

such that in use said ramp voltage producing circuit comprising an output is caused to produce a ramp voltage and feed it into one of the inputs of the voltage comparator circuit, and said stair-stepped voltage producing circuit comprising an output is simultaneously caused to producing a stair-stepped circuit and feed it into another of the inputs of the voltage comparator circuit inputs; such that when the voltages presented at the comparator circuit inputs are equal, a signal is sent by the comparator circuit to said trigger circuit, and the trigger circuit produces a signal at its output which is entered to said input of said circuit for producing said electric waves, such that an electric wave is launched onto an electric signal transmission medium thereby;

b) launching a plurality of electric waves onto said signal transmission media;

c) causing said wave monitoring and data storage system for acquiring and saving data attached to said output of said circuit for producing electric waves, to monitor and save data pertaining to each electric wave launched onto said electric signal transmission medium, including waves reflected therefrom, tangibly displaying at least some of the monitored and saved data, and assembling a magnitude vs. time matrix of data relating to waves launched onto said electric signal transmission medium, said magnitude vs. time matrix being a characterizing signature of the said electric signal transmission medium that indicates an anomaly free, or anomaly containing status.

2. A method as in claim 1, in which a plurality of electric waves are sequentially launched onto said electric signal electric transmission medium, each at a time corresponding to one of the stair-stepped output voltages of said stair-stepped voltage producing circuits.

3. A method as in claim 2 in which said wave monitoring and data storage system monitoring and saves a plurality of data points for each electric wave launched onto said electric signal transmission medium.

4. A method as in claim 3 in which said wave monitoring and data storage system monitors and saves, for each electric wave launched onto said electric signal transmission medium, a plurality of data points for waves reflected from points on said electric signal transmission medium; said saved plurality of reflected data points serving to provide insight into the nature of the signature of the said electric signal transmission medium.

5. A method as in claim 4, in which the electric signal transmission medium is an electric signal transmission line.

6. A method as in claim 4, in which the electric signal transmission medium is an electric signal transmission line in which an impedance anomaly exists.

7. A method as in claim 1 which further comprises the step of analyzing said magnitude vs. time matrix characterizing signature of said electric signal transmission medium, to identify and locate an impedance anomaly on the electric signal transmission medium.

8. A method as in claim 1 which further comprises the step of analyzing said magnitude vs. time matrix characterizing signature of said electric signal transmission medium, to identify and locate an impedance anomaly on the electric signal transmission medium.

9. A computer controlled method of characterizing an electric signal transmission medium as being anomaly free or anomaly containing, comprising:

a) providing a computer that is configured to control a system comprising:

a ramp voltage producing circuit comprising an output, and a stair-stepped voltage producing circuit comprising an output, and a voltage comparator circuit comprising two inputs and an output, said ramp voltage producing circuit being attached to one of said comparator circuit inputs and said stair-stepped voltage producing circuit output being attached to the other of said comparator circuit inputs; and a triggering circuit comprising an input and output, the input of which is attached to the output of said voltage comparator circuit, and a circuit for producing waves that are launched on an electric signal transmission medium comprising an input and output, said trigger circuit output being attached to said input of said circuit for producing said waves, and said output thereof to said electric signal transmission medium; and a wave monitoring and data storage system for acquiring and saving data relating to the waves produced and launched onto an electric signal transmission medium by said circuit for producing electric waves; and said electric signal transmission medium;

b) said computer controlling said ramp voltage producing circuit comprising an output to produce a ramp voltage and feed it into one of the inputs of the voltage comparator circuit, and said computer controlling said stair-stepped voltage producing circuit comprising an output is simultaneously caused to produce a stair-stepped circuit and feed it into another of said inputs, such that when the voltages presented at the comparator circuit inputs are equal, said comparator circuit sends a signal to said trigger circuit and the trigger circuit produces a signal at its output which is entered to said input of said circuit for producing said electric waves, such that each time said trigger circuit produces a signal an electric wave is launched onto said electric signal transmission medium thereby; and c) said computer causing said wave monitoring and data storage system for acquiring and saving data attached to said output of said circuit for producing electric waves, to monitor and save data pertaining to each electric wave launched onto said electric signal transmission medium, and reflections thereof from said electric signal transmission medium; and d) said computer assembling a magnitude vs. time matrix of data relating to waves launched onto said electric signal transmission medium, said magnitude vs. time matrix being a characterizing signature of the said electric signal transmission medium that indicates an anomaly free, or anomaly containing status.

10. A method as in claim 9, in which the electric signal transmission medium is an electric signal transmission line.

11. A method as in claim 10, in which the electric signal transmission line in which an impedance anomaly exists.

* * * * *